US012727134B2

(12) United States Patent
Liu et al.

(10) Patent No.: US 12,727,134 B2
(45) Date of Patent: Sep. 1, 2026

(54) MAGNETIC SHIELDING STRUCTURE FOR WIRELESS CHARGING AND MANUFACTURING METHOD THEREFOR

(71) Applicant: HENGDIAN GROUP DMEGC MAGNETICS CO., LTD, Dongyang City (CN)

(72) Inventors: Lidong Liu, Dongyang City (CN); Yaqi Fu, Dongyang City (CN); Zishun Tang, Dongyang City (CN); Feng Shi, Dongyang City (CN); Aiguo Zhang, Dongyang City (CN)

(73) Assignee: Hengdian Group DMEGC Magnetics Co., Ltd, Dongyang City (CN)

( * ) Notice: Subject to any disclaimer, the term of this patent is extended or adjusted under 35 U.S.C. 154(b) by 389 days.

(21) Appl. No.: 18/555,235

(22) PCT Filed: Jul. 1, 2022

(86) PCT No.: PCT/CN2022/103400

§ 371 (c)(1),
(2) Date: Oct. 12, 2023

(87) PCT Pub. No.: WO2023/005604

PCT Pub. Date: Feb. 2, 2023

(65) Prior Publication Data

US 2024/0196579 A1 Jun. 13, 2024

(30) Foreign Application Priority Data

Jul. 26, 2021 (CN) ......................... 202110842347.0

(51) Int. Cl.

| | |
|---|---|
| ***H05K 9/00*** | (2006.01) |
| ***H02J 50/70*** | (2016.01) |
| ***H05K 7/20*** | (2006.01) |

(52) U.S. Cl.

CPC ............ *H05K 9/0075* (2013.01); *H02J 50/70* (2016.02); *H05K 7/2039* (2013.01)

(58) Field of Classification Search

None

See application file for complete search history.

(56) References Cited

U.S. PATENT DOCUMENTS

2007/0299164 A1* 12/2007 Hayashi .................. H01B 3/12 525/524
2015/0102892 A1 4/2015 Yeo et al.

(Continued)

FOREIGN PATENT DOCUMENTS

CN 108235677 6/2018
CN 108430203 8/2018

(Continued)

OTHER PUBLICATIONS

Abstract Translation of CN 209929767 U (Year: 2020).*

(Continued)

*Primary Examiner* — Kevin M Bernatz
(74) *Attorney, Agent, or Firm* — ArentFox Schiff LLP

(57) ABSTRACT

Disclosed in the present text are a magnetic shielding structure for wireless charging and a manufacturing method therefor, which belong to the technical field of wireless charging. The magnetic shielding structure comprises: a plurality of nanocrystalline units and a heat conduction unit, wherein the heat conduction unit is arranged between the nanocrystalline units, and is used for connecting the nanocrystalline units and conducting heat; and each nanocrystalline unit comprises a multilayer nanocrystalline material. Provided in the application are a magnetic shielding structure and a manufacturing method therefor, which magnetic shielding structure has a relatively small eddy-current loss, a good heat dissipation performance and insulation performance, high flexibility and reliability, and a small volume (Continued)

and a light weight, and is suitable for high-power wireless charging.

7 Claims, 3 Drawing Sheets

(56) References Cited

U.S. PATENT DOCUMENTS

| | | | | |
|---|---|---|---|---|
| 2017/0070075 | A1* | 3/2017 | Percebon | B60L 53/126 |
| 2017/0107409 | A1* | 4/2017 | Harrington | C08G 59/68 |
| 2017/0288279 | A1* | 10/2017 | Ming | C09J 123/0853 |
| 2017/0345555 | A1* | 11/2017 | Jang | H01F 27/2876 |
| 2020/0059118 | A1* | 2/2020 | Xu | H02J 50/12 |
| 2020/0247986 | A1* | 8/2020 | Ito | C08J 5/24 |
| 2022/0402377 | A1* | 12/2022 | Kim | H01F 3/08 |
| 2023/0322099 | A1* | 10/2023 | Kim | B60L 53/12<br>307/104 |
| 2023/0369239 | A1* | 11/2023 | Chen | H10W 74/01 |

FOREIGN PATENT DOCUMENTS

| | | | | |
|---|---|---|---|---|
| CN | 108909113 | | 11/2018 | |
| CN | 109152317 | | 1/2019 | |
| CN | 110335748 | | 10/2019 | |
| CN | 110415952 | | 11/2019 | |
| CN | 209642408 | | 11/2019 | |
| CN | 209949767 | | 1/2020 | |
| CN | 209949767 U | * | 1/2020 | |
| CN | 111554466 | | 8/2020 | |
| CN | 113573552 | | 10/2021 | |
| CN | 113993365 | | 1/2022 | |
| KR | 101813301 B1 | * | 12/2017 | H01F 1/14716 |

OTHER PUBLICATIONS

Abstract Translation of KR 101813301 B1 (Year: 2017).*

International Search Report dated Sep. 29, 2022 from corresponding PCT Application No. PCT/CN2022/103400.

Office action dated Mar. 2, 2022 from corresponding Chinese Application No. 202110842347.0.

* cited by examiner

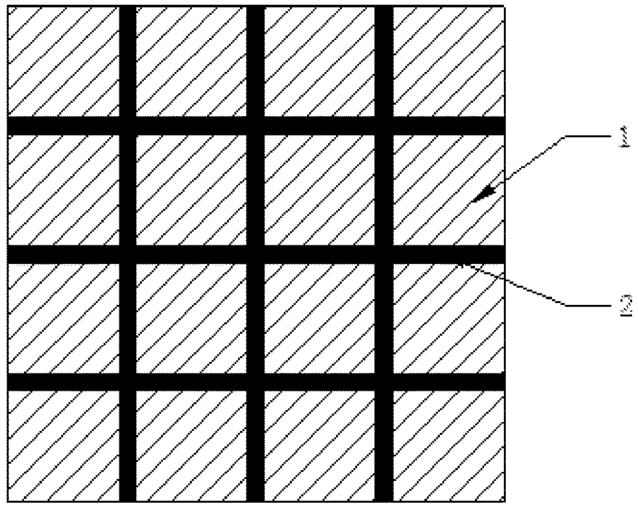
FIG. 1
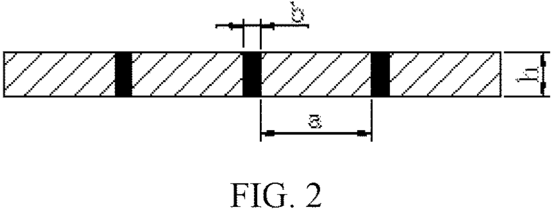
FIG. 2
| | Charging efficiency | Temperature rise (°C) | Weight (g) | Reliability |
|---|---|---|---|---|
| Example 1 | 90.8% | 22 | 1506 | good |
| Comparative Example 1 | 88.1% | 12 | 2555 | friable |
| Comparative Example 2 | 90.5% | 11 | 4224 | friable |
| Comparative Example 3 | 86.5% | 72 | 1547 | good |
FIG. 3

| | Charging efficiency | Temperature rise (°C) | Weight (g) | Reliability |
|---|---|---|---|---|
| Example 2 | 90.6% | 22 | 1527 | good |
| Comparative Example 4 | 89.3% | 20 | 1518 | good |
| Comparative Example 5 | 89.9% | 26 | 1544 | good |

FIG. 4

| | Charging efficiency | Temperature rise (°C) | Weight (g) | Reliability |
|---|---|---|---|---|
| Example 3 | 90.6% | 21 | 1514 | good |
| Comparative Example 6 | 90.7% | 23 | 1537 | poor bonding performance between nanocrystalline material layers, easily falling off |
| Comparative Example 7 | 87.9% | 17 | 1488 | good |

FIG. 5

| | Charging efficiency | Temperature rise (°C) | Weight (g) | Reliability |
|---|---|---|---|---|
| Example 4 | 90.7% | 21 | 1515 | good |
| Comparative Example 8 | 89.4% | 18 | 1501 | good |
| Comparative Example 9 | 88.9% | 38 | 1537 | good |

FIG. 6

| | Charging efficiency | Temperature rise (°C) | Weight (g) | Reliability |
|---|---|---|---|---|
| Example 5 | 90.8% | 21 | 1506 | good |
| Comparative Example 10 | 90.9% | 19 | 1502 | poor bonding performance between nanocrystalline units, easily falling off and separating out |
| Comparative Example 11 | 89.9% | 30 | 1513 | good |
| Comparative Example 12 | 90.1% | 27 | 1511 | good |
| Comparative Example 13 | 90.8% | 20 | 1505 | poor bonding performance between nanocrystalline units, easily falling off and separating out |

FIG. 7

| | Charging efficiency | Temperature rise (°C) | Weight (g) | Reliability |
|---|---|---|---|---|
| Example 6 | 90.7% | 21 | 1523 | good |
| Comparative Example 14 | 90.9% | 22 | 1534 | poor bonding performance between nanocrystalline units, easily falling off |
| Comparative Example 15 | 88.4% | 19 | 1501 | good |

FIG. 8

MAGNETIC SHIELDING STRUCTURE FOR WIRELESS CHARGING AND MANUFACTURING METHOD THEREFOR

CROSS REFERENCE TO RELATED APPLICATION(S)

This application is a national stage application filed under 35 U.S.C. 371 based on International Patent Application No. PCT/CN2022/103400, filed on Jul. 1, 2022, which claims priority to Chinese Patent Application No. 202110842347.0 filed with the China National Intellectual Property Administration (CNIPA) on Jul. 26, 2021, the disclosures of which are incorporated herein by reference in their entireties.

TECHNICAL FIELD

Embodiments of the present application relate to the technical field of wireless charging, for example, a magnetic shielding structure for wireless charging and a manufacturing method therefor.

BACKGROUND

With the rapid development of the electric vehicle industry, wireless charging for vehicles has attracted more and more attention. The wireless charging is more intelligent, safe and convenient than wired charging technology. Compared with the consumer electronics (such as mobile phones), electric vehicles requires higher power in the wireless charging system, generally more than 6 kW, and the complexity and technical difficulty of the system are also higher. Magnetic material is an important part of the high-power wireless charging system, which is mainly used for magnetic conduction and shielding. The magnetic material with excellent performance can greatly improve the coupling coefficient of the charging system, thus increasing the charging efficiency, and at the same time can effectively prevent leakage of electromagnetic fields, avoiding interference or damage to the external environment.

At present, the magnetic material used for the receiver unit of high-power wireless charging system is mainly the soft magnetic ferrite material, which has high magnetic permeability and resistivity as well as good magnetic isolation and low eddy current loss. However, the ferrite material also has obvious shortcomings, such as low saturation magnetization (generally less than 0.5 T), brittle texture, and friability; the low saturation magnetization brings the material large size and heavy weight, which is not conducive to the miniaturization of devices. Meanwhile, restricted by the manufacturing process, the ferrite magnetic plate is generally limited in size, and therefore, the magnetic plate used for the high-power wireless charging receiver unit is mostly spliced with a plurality of ferrite magnetic plates, which facilitates the magnetic plate breaking when the vehicle is running in conjunction with the inherent brittleness of ferrite, greatly reducing the reliability of the system.

Compared with the soft magnetic ferrite material, the nanocrystalline material has higher saturation magnetization, more than twice the value of ferrite material. Besides, the nanocrystalline material can be prepared into flexible magnetic sheets by means of splitting and adhering, overcoming the defect of friability. However, the nanocrystalline material still has some defects, such as low resistivity, which leads to significant eddy currents when the material is used at high frequency, resulting in high loss; especially for the high-power wireless charging system, large quantities of heat energy will be generated by the strong eddy current effect and high loss and cannot be dissipated in time, eventually reducing the charging efficiency and safety of the system. Subjecting the nanocrystalline material to splitting and adhering processes can increase the use frequency of the nanocrystalline material and reduce the eddy current loss to a certain extent, but for the high-power wireless charging system, the eddy current loss and heat generation problems are still serious, mainly because some microcracks form on the nanocrystalline surface after the splitting, i.e., lots of micro-crushing units (at submicron level) of uneven size and shape form on the nanocrystalline strip surface, and the sharp corners of micro-crushing units will produce obvious magnetic field concentration, causing high loss and serious heat generation during the operation; additionally, due to the filming adhering process, the polymer material in the adhesive layer cannot effectively fill into the microcracks, and the insulation effect is greatly reduced. In addition, the adhesive used in the filming adhering process has poor heat conductivity, and the heat generated by eddy current loss cannot be effectively and quickly dissipated.

Therefore, the existing technology needs to be improved and developed.

SUMMARY

The following is a summary of the subject described in detail herein. This summary is not intended to limit the protection scope of the claims.

An embodiment of the present application provides a magnetic shielding structure for wireless charging and a manufacturing method therefor, which has low eddy current loss, good heat dissipation, good insulation performance, good flexibility, high reliability, small size and light weight.

A magnetic shielding structure for wireless charging comprises a plurality of nanocrystalline units and a heat conduction unit, and the heat conduction unit is arranged between the plurality of nanocrystalline units for connecting each nanocrystalline unit and conducting heat; the nanocrystalline unit comprises a plurality of layers of nanocrystalline material.

As an optional solution of the magnetic shielding structure for wireless charging, a material of the heat conduction unit comprises a thermal conductive pouring sealant and an epoxy resin.

As an optional solution of the magnetic shielding structure for wireless charging, the thermal conductive pouring sealant is a silica gel material, and the epoxy resin is a polyamide-modified epoxy resin.

As an optional solution of the magnetic shielding structure for wireless charging, the thermal conductive pouring sealant and the epoxy resin have a mass ratio of 1:1 to 5:1.

As an optional solution of the magnetic shielding structure for wireless charging, pluralities of layers of the nanocrystalline material are bonded to each other by an adhesive layer.

As an optional solution of the magnetic shielding structure for wireless charging, the nanocrystalline unit is square, and the plurality of nanocrystalline units are distributed as a matrix, and the formed magnetic shielding structure is square.

As an optional solution of the magnetic shielding structure for wireless charging, the nanocrystalline unit has a side length of 5-15 mm and a thickness of 1-10 mm As an optional solution of the magnetic shielding structure for wireless charging, each nanocrystalline material layer of the nanocrystalline unit has a thickness of 14-20 μm, and a distance between adjacent nanocrystalline units is 0.1-0.5 mm.

A manufacturing method for the magnetic shielding structure for wireless charging comprises the following steps:

a. subjecting a nanocrystalline strip to double-sided film adhering and splitting in sequence, and then stacking and bonding a plurality of layers of nanocrystalline strip via adhesive layers to achieve a desired thickness h;
b. cutting a composite material of the plurality of layers of nanocrystalline strip and the adhesive layers obtained in step (1) into a plurality of nanocrystalline units which are rectangular with a square top;
c. arranging and fixing the plurality of nanocrystalline units obtained in step (2) on a mold or a plate with a distance b between adjacent nanocrystalline units;
d. mixing and stirring a thermal conductive pouring sealant and an epoxy resin proportionally to obtain an adhesive material which is used to form a heat conduction unit;
e. filling the adhesive material of the heat conduction unit obtained in step (4) into gaps between the nanocrystalline units in step (3) to form a semi-finished magnetic shielding structure; and
f. curing the semi-finished magnetic shielding structure obtained in step (5) to obtain the finished magnetic shielding structure.

The present application has the following beneficial effects: the magnetic shielding structure is composed of a plurality of nanocrystalline units, a heat conduction unit is arranged between the nanocrystalline units, and a material of the heat conduction unit can be a mixture of a thermal conductive pouring sealant and an epoxy resin; on the one hand, the heat conduction unit can connect each nanocrystalline unit and, on the other hand, can conduct and dissipate heat, giving the magnetic shielding structure of the present application a good heat dissipation and applicability to high-power wireless charging. Compared with those only using nanocrystalline strips as magnetic shielding material, the magnetic shielding structure provided in the present application, which is composed of a plurality of nanocrystalline units, has higher charging efficiency and less heat generation as well as higher reliability. By being embedded into the heat conduction material, the nanocrystalline unit has smaller size than the long nanocrystalline strip, significantly reducing the eddy current loss, and meanwhile, the addition of the heat conduction material increases the heat conductivity of the magnetic shielding structure, and the heat generated by the eddy current loss is quickly dissipated.

Other aspects can be understood upon reading and understanding the drawings and detailed description.

BRIEF DESCRIPTION OF DRAWINGS

Drawings are used to provide a further understanding of the technical solutions herein and form part of the specification. The drawings are used in conjunction with examples of the present application to explain the technical solutions herein, and do not limit the technical solutions herein.

FIG. 1 is a schematic front view of a magnetic shielding structure for wireless charging in an example of the present application.

FIG. 2 is a schematic side view of a magnetic shielding structure for wireless charging in an example of the present application.

FIG. 3 shows a test result comparison of Example 1 and Comparative Examples 1-3 in the present application.

FIG. 4 shows a test result comparison of Example 2 and Comparative Examples 4-5 in the present application.

FIG. 5 shows a test result comparison of Example 3 and Comparative Examples 6-7 in the present application.

FIG. 6 shows a test result comparison of Example 4 and Comparative Examples 8-9 in the present application.

FIG. 7 shows a test result comparison of Example 5 and Comparative Examples 10-13 in the present application.

FIG. 8 shows a test result comparison of Example 6 and Comparative Examples 14-15 in the present application.

DETAILED DESCRIPTION

The present application will be described in further detail below through drawings and examples. It should be understood that the specific examples described herein are only intended to explain the present application but not limit the present application. It should be noted that, for a better illustration, the drawings only show the relevant partial structure of the present application rather than the whole structure.

In the description of the example, the terms “up”, “down”, “left”, “right” and other orientation or position relationships are based on the orientation or position relationships shown by the drawings, which are intended only to facilitate description and simplify operation rather than indicating or implying that the device or element referred to must have a particular orientation or must be constructed and operated in a particular orientation, and thus should not be construed as limiting the present application.

The technical solutions of the present application will be further described below through the drawings and detailed description.

An embodiment of the present application provides a magnetic shielding structure for wireless charging. FIG. 1 is a schematic front view of a magnetic shielding structure for wireless charging in the present application. As shown in FIG. 1, the whole magnetic shielding structure includes a plurality of nanocrystalline units 1 and a heat conduction unit 2, and the heat conduction unit is arranged between the plurality of nanocrystalline units, wherein on the one hand, the heat conduction unit can connect each nanocrystalline unit and, on the other hand, can conduct and dissipate heat, giving the magnetic shielding structure of the present application a good heat dissipation and applicability to high-power wireless charging especially. The nanocrystalline unit comprises a plurality of layers of nanocrystalline material, and the plurality of layers of nanocrystalline material are stacked in turn to form the nanocrystalline unit; the nanocrystalline material is mainly to provide magnetism for magnetic isolation and shielding. The pluralities of layers of nanocrystalline material are bonded to each other by an adhesive layer, and the adhesive layers are used for bonding the nanocrystalline materials and insulation. FIG. 2 is a schematic side view of a magnetic shielding structure for wireless charging in the present application. As shown in FIG. 2, the “nanocrystalline unit comprises a plurality of layers of nanocrystalline material” refers to the arrangement that the layers of nanocrystalline material are stacked in the direction of a thickness h of the magnetic shielding structure to form the nanocrystalline unit with a certain thickness h. Adjacent layers of nanocrystalline material are bonded to each other by an adhesive layer.

In an embodiment of the present application, an alloy system and composition of the nanocrystalline are not limited but should bring good soft magnetic properties, and a Fe—Si—Nb—B—Cu system is preferably selected. The real part of magnetic permeability of the nanocrystalline material is 600-15000 at an operating frequency of 100 kHz. A single nanocrystalline material layer has a thickness of 14-20 μm, and the adhesive layer has a thickness of 5-12 μm, preferably 5-8 μm. Combined with FIG. 1 and FIG. 2, it can be seen that as shown in FIG. 1, the nanocrystalline unit is square on the front, the plurality of nanocrystalline units are distributed as a matrix, and the formed magnetic shielding structure is also square on the front. With reference to FIG. 2, the nanocrystalline unit has a certain thickness h, and thus the whole nanocrystalline unit is rectangular with a square front. The front of the nanocrystalline unit has a side length a of 5-15 mm; if the side length a is too large, the eddy current loss will be greatly increased, leading to serious heat generation of the system, and if the side length a is too small, the nanocrystalline units will be separated excessively far from each other by the heat conduction unit, i.e., increasing the air gaps, which will significantly reduce the magnetic permeability of the whole magnetic shielding structure and further affect the coupling coefficient and wireless charging efficiency of the system. Meanwhile, although the eddy current loss can be reduced by the introduction of a large amount of air gaps to a certain extent, the hysteresis loss will increase. The thickness h of the nanocrystalline unit, i.e., the thickness h of the magnetic shielding structure, is 1-10 mm, preferably 2-5 mm.

The heat conduction unit can be prepared by mixing a thermal conductive pouring sealant and an epoxy resin. The thermal conductive pouring sealant is mainly used for heat conduction and insulation, and the epoxy resin is mainly used for bonding effect to improve the bonding strength of the nanocrystalline units. The cured thermal conductive pouring sealant has good heat conductivity, bonding performance and flexibility. The thermal conductive pouring sealant is preferably a silica gel material. The epoxy resin includes an epoxy resin and a modified epoxy resin; the epoxy resin is required to possess good bonding performance and also some flexibility after cured, which is preferably a polyamide-modified epoxy resin. The thermal conductive pouring sealant and the epoxy resin have a mass ratio of (1:1) to (5:1). The heat conduction units are distributed among the nanocrystalline units; in the present application, as shown in FIG. 2, a distance b between adjacent nanocrystalline units 1, i.e., a width b of the heat conduction unit, is 0.1-0.5 mm, preferably 0.1-0.3 mm. If the b value is too large, the distance between the nanocrystalline units will be increased, thereby reducing the proportion of magnetic phase in the whole magnetic shielding structure. In the present application, the heat conduction unit has excellent flexibility and bonding performance, which avoids the nanocrystalline material from falling off or breaking during operation and greatly improves the reliability of the system.

Compared with the conventional ferrite magnetic shielding structure, the nanocrystalline-based magnetic shielding structure provided in the present application is lighter in weight, smaller in size, higher in reliability and also slightly higher in charging efficiency. A high-power wireless charging system based on the magnetic shielding structure provided in the present application has higher efficiency, less heat generation and also higher reliability than a system using only nanocrystalline strips as the magnetic shielding material. By being embedded into the heat conduction material, the nanocrystalline unit has smaller size than the long nanocrystalline strip, significantly reducing the eddy current loss, and meanwhile, the addition of the heat conduction material increases the heat conductivity of the magnetic shielding structure, and the heat generated by the eddy current loss is quickly dissipated.

An embodiment of the present application provides a manufacturing method for the magnetic shielding structure, comprising the following steps:

a. subjecting an annealed nanocrystalline strip to double-sided film adhering and splitting in sequence, and then stacking and bonding a plurality of layers of nanocrystalline strip via adhesive layers to achieve a desired thickness h;

the splitting is to micro-crush the nanocrystalline strip and thus improves the high frequency characteristics of the nanocrystalline strip, and via a splitting method and a splitting strength, the real part of magnetic permeability of the nanocrystalline strip can be regulated, and the splitting method is not limited, preferably double-roller rolling;

(2) cutting a composite material of the plurality of layers of nanocrystalline strip and the adhesive layers obtained in step (1) into a plurality of nanocrystalline units which are rectangular with a square top, i.e., cutting into a plurality of a*a*h rectangular solids to obtain the nanocrystalline units; a cutting method is not limited, including but not limited to wire cutting, laser cutting, die cutting, etc.;

(3) arranging and fixing the plurality of nanocrystalline units obtained in step (2) on a mold or a plate with a distance b guaranteed between adjacent nanocrystalline units;

(4) mixing and stirring a thermal conductive pouring sealant and an epoxy resin proportionally to obtain an adhesive material which is uniformly mixed and used to form a heat conduction unit;

(5) filling the adhesive material of the heat conduction unit obtained in step (4) into gaps between the nanocrystalline units in step (3) to form a semi-finished magnetic shielding structure; the adhesive material of the heat conduction unit is required to completely fill into the gaps between the nanocrystalline units, and well bond with the cross-sections of the nanocrystalline units, and there should be no obvious air bubbles in the adhesive material; a filling method is not limited, including but not limited to injection, dispensing, impregnation, preferably pressure impregnation, i.e., performing impregnation under a certain pressure; and (6) curing the semi-finished magnetic shielding structure obtained in step (5) to obtain the finished magnetic shielding structure; a curing condition is not limited, and the curing is preferably performed at room temperature or low temperature, and the curing temperature is less than or equal to 80° C.; the magnetic shielding structure for high-power wireless charging is finally obtained.

Example 1

A magnetic shielding structure essentially comprises two parts: nanocrystalline units; and a heat conduction unit (thermally conductive adhesive).

The nanocrystalline units are composed of 120 nanocrystalline material layers and 119 adhesive layers; the nanocrystalline material has a composition of $Fe_{73.5}Si_{13.5}Nb_3B_9Cu_1$, the real part of magnetic permeability of the nanocrystalline material is 10354 at an operating frequency of 100 kHz, the nanocrystalline material has an average thickness of 19 μm, and the adhesive layer has a thickness of 6 μm; the nanocrystalline units are rectangular, wherein a surface is square, and a side length a is 10 mm.

The heat conduction unit is a mixture composed of a thermal conductive pouring sealant and an epoxy resin; the thermal conductive pouring sealant is a two-component silica gel material; the epoxy resin is a polyamide-modified epoxy resin; the thermal conductive pouring sealant and the epoxy resin have a mass ratio of 2:1. A distance between adjacent nanocrystalline units, i.e., b, is 0.2 mm.

The magnetic shielding structure composed of the nanocrystalline units and the heat conduction unit has a thickness h of 3 mm, and the length*width*thickness of the magnetic shielding structure is 420 mm*420 mm*3 mm.

Tests:

Firstly, the magnetic permeability of a nanocrystalline strip is tested for subsequent calculations, and such nanocrystalline strip is the nanocrystalline strip in step (1): the nanocrystalline strip is punched into a ring with an outer diameter of 18.8 mm and an inner diameter of 9.9 mm and subjected to the magnetic permeability test. The test equipment is Keysight E4990A, and a test frequency is 100 kHz.

The magnetic shielding structure of the present application is tested for the wireless charging efficiency and temperature rise: the magnetic shielding structure is placed in a high-power wireless charging system, and the charging efficiency of the wireless charging system is tested after 30 minutes of operation; the temperature of the magnetic shielding structure surface is tested by a thermodetector, the maximum temperatures of the magnetic shielding structure surface are recorded before charging and after 30 minutes of operation, and the temperature rise is calculated before and after the charging; the wireless charging system has a power of 11 kW. The magnetic shielding structure is weighed using a balance and tested for the reliability preliminarily, and the reliability includes impact resistance and bonding performance between the nanocrystalline units.

Comparative Example 1

As a comparative example of Example 1, the magnetic shielding structure for wireless charging is spliced with 16 square ferrites, wherein a material of ferrite is manganese zinc ferrite and has a trade name of PC95, each square ferrite has a size of 105 mm*105 mm*3 mm, and the square ferrites are directly bonded with an epoxy resin.

Comparative Example 2

As a comparative example of Example 1, the magnetic shielding structure for wireless charging is spliced with 16 square ferrites, wherein a material of ferrite is manganese zinc ferrite and has a trade name of PC95, each square ferrite has a size of 105 mm*105 mm*5 mm, and the square ferrites are directly bonded with an epoxy resin.

Comparative Example 3

As a comparative example of Example 1, the magnetic shielding structure for wireless charging is flat-layered spliced with 7 nanocrystalline strips obtained in step (1) of Example 1, which had not been subjected to the cutting in step (2) as well as the subsequent design and processing. The plurality of layers of nanocrystalline strip has a size of 60 mm*420 mm*3 mm, and the nanocrystalline strips are bonded to each other with the conductive material of the heat conduction unit in Example 1.

The test results of Example 1 and Comparison Examples 1-3 are shown in FIG. 3. It can be seen from the test results that when the magnetic shielding structures have the same thickness, the special design provided in the present application has more advantages in charging efficiency, light weight and reliability. When the thickness of the ferrite is increased to 5 mm, the efficiency is comparable to that of the present application, but the gap in light weight and reliability is obviously expanded. Although the temperature rise after 30 minutes of charging of the magnetic shielding structure provided in the present application is slightly high, the influence on the safety of the whole system is little. Compared with the magnetic shielding structure of flat-layered nanocrystalline strips, the present application has significant advantages in charging efficiency and temperature rise.

Example 2

A magnetic shielding structure essentially comprises two parts: nanocrystalline units; and a heat conduction unit.

The nanocrystalline units are composed of 120 nanocrystalline material layers and 119 adhesive layers; the nanocrystalline material has a composition of $Fe_{73.5}Si_{13.5}Nb_3B_9Cu_1$, the real part of magnetic permeability of the nanocrystalline material is 1634 at an operating frequency of 100 kHz, the nanocrystalline material has an average thickness of 20 μm, and the adhesive layer has a thickness of 5 μm; the nanocrystalline units are rectangular, wherein a surface is square, and a side length a is 14 mm.

The heat conduction unit is a mixture composed of a thermal conductive pouring sealant and an epoxy resin; the thermal conductive pouring sealant is a two-component silica gel material; the epoxy resin is a polyamide-modified epoxy resin; the thermal conductive pouring sealant and the epoxy resin have a mass ratio of 4.5:1. A distance between adjacent nanocrystalline units, i.e., b, is 0.3 mm.

The magnetic shielding structure composed of the nanocrystalline units and the heat conduction unit has a thickness h of 3 mm.

Tests:

Firstly, the magnetic permeability of a nanocrystalline strip is tested for subsequent calculations, and such nanocrystalline strip is the nanocrystalline strip in step (1): the nanocrystalline strip is punched into a ring with an outer diameter of 18.8 mm and an inner diameter of 9.9 mm and subjected to the magnetic permeability test. The test equipment is Keysight E4990A, and a test frequency is 100 kHz.

The magnetic shielding structure of the present application is tested for the wireless charging efficiency and temperature rise: the magnetic shielding structure is placed in a high-power wireless charging system, and the charging efficiency of the wireless charging system is tested after 30 minutes of operation; the temperature of the magnetic shielding structure surface is tested by a thermodetector, the maximum temperatures of the magnetic shielding structure surface are recorded before charging and after 30 minutes of operation, and the temperature rise is calculated before and after the charging; the wireless charging system has a power of 11 kW. The magnetic shielding structure is weighed using a balance and tested for the reliability preliminarily, and the reliability includes impact resistance and bonding performance between the nanocrystalline units.

Comparative Example 4

As a comparative example of Example 2, the difference is that the real part of magnetic permeability of the nanocrystalline material is 567, and others are the same as in Example 2.

Comparative Example 5

As a comparative example of Example 2, the difference is that the real part of magnetic permeability of the nanocrystalline material is 16450, and others are the same as in Example 2.

The test results of Example 2, Comparative Example 4 and Comparative Example 5 are shown in FIG. 4. It can be seen from the test results that when the magnetic permeability of the nanocrystalline material exceeds the defined range, the efficiency of the whole charging system will decrease.

Example 3

A magnetic shielding structure essentially comprises two parts: nanocrystalline units; and a heat conduction unit.

The nanocrystalline units are composed of 120 nanocrystalline material layers and 119 adhesive layers; the nanocrystalline material has a composition of $Fe_{73.5}Si_{13.5}Nb_3B_9Cu_1$, the real part of magnetic permeability of the nanocrystalline material is 2153 at an operating frequency of 100 kHz, the nanocrystalline material has an average thickness of 19 μm, and the adhesive layer has a thickness of 6 μm; the nanocrystalline units are rectangular, wherein a surface is square, and a side length a is 12 mm.

The heat conduction unit is a mixture composed of a thermal conductive pouring sealant and an epoxy resin; the thermal conductive pouring sealant is a two-component silica gel material; the epoxy resin is a polyamide-modified epoxy resin; the thermal conductive pouring sealant and the epoxy resin have a mass ratio of 1.5:1. A distance between adjacent nanocrystalline units, i.e., b, is 0.2 mm.

The magnetic shielding structure composed of the nanocrystalline units and the heat conduction unit has a thickness h of 3 mm.

Tests:

Firstly, the magnetic permeability of a nanocrystalline strip is tested for subsequent calculations, and such nanocrystalline strip is the nanocrystalline strip in step (1): the nanocrystalline strip is punched into a ring with an outer diameter of 18.8 mm and an inner diameter of 9.9 mm and subjected to the magnetic permeability test. The test equipment is Keysight E4990A, and a test frequency is 100 kHz.

The magnetic shielding structure of the present application is tested for the wireless charging efficiency and temperature rise: the magnetic shielding structure is placed in a high-power wireless charging system, and the charging efficiency of the wireless charging system is tested after 30 minutes of operation; the temperature of the magnetic shielding structure surface is tested by a thermodetector, the maximum temperatures of the magnetic shielding structure surface are recorded before charging and after 30 minutes of operation, and the temperature rise is calculated before and after the charging; the wireless charging system has a power of 11 kW. The magnetic shielding structure is weighed using a balance and tested for the reliability preliminarily, and the reliability includes impact resistance and bonding performance between the nanocrystalline units.

Comparative Example 6

As a comparative example of Example 3, the difference is that the thickness of the adhesive layer in the nanocrystalline units 1 is 3 μm, and there are 136 nanocrystalline material layers and 135 adhesive layer layers, and others are the same as in Example 3.

Comparative Example 7

As a comparative example of Example 3, the difference is that the thickness of the adhesive layer in the nanocrystalline units is 14 μm, and there are 92 nanocrystalline material layers and 91 adhesive layer layers, and others are the same as in Example 3.

The test results of Example 3, Comparative Example 6 and Comparative Example 7 are shown in FIG. 5. It can be seen from the test results that when the thickness of the adhesive layer is too small, the bonding performance between the nanocrystalline material layers will be poor, and the reliability will decrease; when the thickness of the adhesive layer is too large, the magnetic isolation and shielding effect of the magnetic material will decrease, affecting the coupling coefficient of the whole system and reducing the charging efficiency of the wireless charging system.

Example 4

A magnetic shielding structure essentially comprises two parts: nanocrystalline units; and a heat conduction unit.

The nanocrystalline units are composed of 120 nanocrystalline material layers and 119 adhesive layers; the nanocrystalline material has a composition of $Fe_{73.5}Si_{13.5}Nb_3B_9Cu_1$, the real part of magnetic permeability of the nanocrystalline material is 3146 at an operating frequency of 100 kHz, the nanocrystalline material has an average thickness of 20 μm, and the adhesive layer has a thickness of 5 μm; the nanocrystalline units are rectangular, wherein a surface is square, and a side length a is 11 mm.

The heat conduction unit is a mixture composed of a thermal conductive pouring sealant and an epoxy resin; the thermal conductive pouring sealant is a two-component silica gel material; the epoxy resin is a polyamide-modified epoxy resin; the thermal conductive pouring sealant and the epoxy resin have a mass ratio of 2:1. A distance between adjacent nanocrystalline units 1, i.e., b, is 0.1 mm μm.

The magnetic shielding structure composed of the nanocrystalline units and the heat conduction unit has a thickness h of 3 mm.

Tests:

Firstly, the magnetic permeability of a nanocrystalline strip is tested for subsequent calculations, and such nanocrystalline strip is the nanocrystalline strip in step (1): the nanocrystalline strip is punched into a ring with an outer diameter of 18.8 mm and an inner diameter of 9.9 mm and subjected to the magnetic permeability test. The test equipment is Keysight E4990A, and a test frequency is 100 kHz.

The magnetic shielding structure of the present application is tested for the wireless charging efficiency and temperature rise: the magnetic shielding structure is placed in a high-power wireless charging system, and the charging efficiency of the wireless charging system is tested after 30 minutes of operation; the temperature of the magnetic shielding structure surface is tested by a thermodetector, the maximum temperatures of the magnetic shielding structure surface are recorded before charging and after 30 minutes of operation, and the temperature rise is calculated before and after the charging; the wireless charging system has a power of 11 kW. The magnetic shielding structure is weighed using a balance and tested for the reliability preliminarily, and the reliability includes impact resistance and bonding performance between the nanocrystalline units.

Comparative Example 8

As a comparative example of Example 4, the difference is that the side length a is 4 mm in the nanocrystalline units, and others are the same as in Example 4.

Comparative Example 9

As a comparative example of Example 4, the difference is that the side length a is 16 mm in the nanocrystalline units, and others are the same as in Example 4.

The test results of Example 4, Comparative Example 8 and Comparative Example 9 are shown in FIG. 6. It can be seen from the test results that when the a value exceeds the defined range, the charging efficiency of the system will significantly decrease, and at the same time, when the a value is too large, the eddy current loss will be excessively large, and the temperature rise will be more obvious.

Example 5

A magnetic shielding structure essentially comprises two parts: nanocrystalline units; and a heat conduction unit.

The nanocrystalline units are composed of 120 nanocrystalline material layers and 119 adhesive layers; the nanocrystalline material has a composition of $Fe_{73.5}Si_{13.5}Nb_3B_9Cu_1$, the real part of magnetic permeability of the nanocrystalline material is 14371 at an operating frequency of 100 kHz, the nanocrystalline material has an average thickness of 20 μm, and the adhesive layer has a thickness of 5 μm; the nanocrystalline units are rectangular, wherein a surface is square, and a side length a is 6 mm.

The heat conduction unit is a mixture composed of a thermal conductive pouring sealant and an epoxy resin; the thermal conductive pouring sealant is a two-component silica gel material; the epoxy resin is a polyamide-modified epoxy resin; the thermal conductive pouring sealant and the epoxy resin have a mass ratio of 3:1. A distance between adjacent nanocrystalline units, i.e., b, is 0.2 mm μm.

The magnetic shielding structure composed of the nanocrystalline units and the heat conduction unit has a thickness h of 3 mm.

Tests:

Firstly, the magnetic permeability of a nanocrystalline strip is tested for subsequent calculations, and such nanocrystalline strip is the nanocrystalline strip in step (1): the nanocrystalline strip is punched into a ring with an outer diameter of 18.8 mm and an inner diameter of 9.9 mm and subjected to the magnetic permeability test. The test equipment is Keysight E4990A, and a test frequency is 100 KHz.

The magnetic shielding structure of the present application is tested for the wireless charging efficiency and temperature rise: the magnetic shielding structure is placed in a high-power wireless charging system, and the charging efficiency of the wireless charging system is tested after 30 minutes of operation; the temperature of the magnetic shielding structure surface is tested by a thermodetector, the maximum temperatures of the magnetic shielding structure surface are recorded before charging and after 30 minutes of operation, and the temperature rise is calculated before and after the charging; the wireless charging system has a power of 11 kW. The magnetic shielding structure is weighed using a balance and tested for the reliability preliminarily, and the reliability includes impact resistance and bonding performance between the nanocrystalline units.

Comparative Example 10

As a comparative example of Example 5, the difference is that the heat conduction unit only uses the thermal conductive pouring sealant but no epoxy resin, and others are the same as in Example 5.

Comparative Example 11

As a comparison example of Example 5, the difference is that the heat conduction unit only uses the epoxy resin but no thermal conductive pouring sealant, and others are the same as in Example 5.

Comparative Example 12

As a comparison example of Example 5, the difference is that in the heat conduction unit, the thermal conductive pouring sealant and the epoxy resin have a mass ratio of 0.8:1, and others are the same as in Example 5.

Comparative Example 13

As a comparison example of Example 5, the difference is that in the heat conduction unit, the thermal conductive pouring sealant and the epoxy resin have a mass ratio of 6:1, and others are the same as in Example 5.

The test results of Example 5 and Comparative Examples 10-13 are shown in FIG. 7. It can be seen from the test results that when no epoxy resin is added to the heat conduction unit or its content is low, the bonding performance of the adhesive material will be poor, and the reliability will be low; when no thermal conductive pouring sealant is added to the heat conduction unit or its content is low, the heat dissipation of the heat conduction unit will be poor, which affects the charging efficiency accordingly.

Example 6

A magnetic shielding structure essentially comprises two parts: nanocrystalline units; and a heat conduction unit.

The nanocrystalline units are composed of 120 nanocrystalline material layers and 119 adhesive layers; the nanocrystalline material has a composition of $Fe_{73.5}Si_{13.5}Nb_3B_9Cu_1$, the real part of magnetic permeability of the nanocrystalline material is 5314 at an operating frequency of 100 kHz, the nanocrystalline material has an average thickness of 20 μm, and the adhesive layer has a thickness of 5 μm; the nanocrystalline units are rectangular, wherein a surface is square, and a side length a is 10 mm.

The heat conduction unit is a mixture composed of a thermal conductive pouring sealant and an epoxy resin; the thermal conductive pouring sealant is a two-component silica gel material; the epoxy resin is a polyamide-modified epoxy resin; the thermal conductive pouring sealant and the epoxy resin have a mass ratio of 4.5:1. A distance between adjacent nanocrystalline units, i.e., b, is 0.3 mm μm.

The magnetic shielding structure composed of the nanocrystalline units and the heat conduction unit has a thickness h of 3 mm.

Tests:

Firstly, the magnetic permeability of a nanocrystalline strip is tested for subsequent calculations, and such nanocrystalline strip is the nanocrystalline strip in step (1): the nanocrystalline strip is punched into a ring with an outer diameter of 18.8 mm and an inner diameter of 9.9 mm and subjected to the magnetic permeability test. The test equipment is Keysight E4990A, and a test frequency is 100 kHz.

The magnetic shielding structure of the present application is tested for the wireless charging efficiency and temperature rise: the magnetic shielding structure is placed in a high-power wireless charging system, and the charging efficiency of the wireless charging system is tested after 30 minutes of operation; the temperature of the magnetic shielding structure surface is tested by a thermodetector, the maximum temperatures of the magnetic shielding structure surface are recorded before charging and after 30 minutes of operation, and the temperature rise is calculated before and after the charging; the wireless charging system has a power of 11 kW. The magnetic shielding structure is weighed using a balance and tested for the reliability preliminarily, and the reliability includes impact resistance and bonding performance between the nanocrystalline units.

Comparative Example 14

As a comparative example of Example 6, the difference is that the distance between adjacent nanocrystalline units is 0.08 mm, and others are the same as in Example 6.

Comparative Example 15

As a comparative example of Example 6, the difference is that the distance between adjacent nanocrystalline units is 0.6 mm, and others are the same as in Example 6.

The test results of Example 6, Comparative Example 14 and Comparative Example 15 are shown in FIG. 8. It can be seen from the test result that when the b value is too small, the thermally conductive adhesive cannot completely fill the gaps between the nanocrystalline units, resulting in poor system reliability; when the b value is too large, the magnetic isolation and shielding effect of the whole magnetic shielding structure will decrease, reducing the coupling coefficient of the charging system, which worsens the charging efficiency.

Obviously, the examples of the present application are merely examples to clearly illustrate the present application, and are not intended to limit the implementation of the present application. For those skilled in the art, various obvious variations, readjustments and substitutions can be made without departing from the protection scope of the present application. It is not necessary or possible to exhaust all the ways of implementation here. Any modification, equivalent substitution, improvement, etc. made within the spirit and principles of the present application shall fall within the protection scope defined by the claims of the present application.

What is claimed is:

1. A magnetic shielding structure for wireless charging, comprising a plurality of nanocrystalline units and a heat conduction unit, and the heat conduction unit is arranged between the plurality of nanocrystalline units for connecting each nanocrystalline unit and conducting heat; the nanocrystalline unit comprises a plurality of layers of nanocrystalline material;

wherein a material of the heat conduction unit comprises a thermal conductive pouring sealant and an epoxy resin, the thermal conductive pouring sealant is silica gel material, and the epoxy resin is a polyamide-modified epoxy resin.

2. The magnetic shielding structure for wireless charging according to claim 1, wherein the thermal conductive pouring sealant and the epoxy resin have a mass ratio of 1:1 to 5:1.

3. The magnetic shielding structure for wireless charging according to claim 1, wherein pluralities of layers of the nanocrystalline material are bonded to each other by an adhesive layer.

4. The magnetic shielding structure for wireless charging according to claim 1, wherein the nanocrystalline unit is square, and the plurality of nanocrystalline units are distributed as a matrix, and the formed magnetic shielding structure is square.

5. The magnetic shielding structure for wireless charging according to claim 4, wherein the nanocrystalline unit has a side length of 5-15 mm and a thickness of 1-10 mm.

6. The magnetic shielding structure for wireless charging according to claim 1, wherein each nanocrystalline material layer of the nanocrystalline unit has a thickness of 14-20 μm, and a distance between adjacent nanocrystalline units is 0.1-0.5 mm.

7. A manufacturing method for the magnetic shielding structure for wireless charging according to claim 1, comprising the following steps:

(1) subjecting a nanocrystalline strip to double-sided film adhering and splitting in sequence, and then stacking and bonding a plurality of layers of nanocrystalline strip via adhesive layers to achieve a desired thickness h;

(2) cutting a composite material of the plurality of layers of nanocrystalline strip and the adhesive layers obtained in step (1) into a plurality of nanocrystalline units which are rectangular with a square top;

(3) arranging and fixing the plurality of nanocrystalline units obtained in step (2) on a mold or a plate with a distance b between adjacent nanocrystalline units;

(4) mixing and stirring a thermal conductive pouring sealant and an epoxy resin proportionally to obtain an adhesive material which is used to form a heat conduction unit;

(5) filling the adhesive material of the heat conduction unit obtained in step (4) into gaps between the nanocrystalline units in step (3) to form a semi-finished magnetic shielding structure; and (6) curing the semi-finished magnetic shielding structure obtained in step (5) to obtain the finished magnetic shielding structure.

* * * * *